United States Patent
Aoki

(10) Patent No.: US 10,534,277 B2
(45) Date of Patent: Jan. 14, 2020

(54) MOVABLE BODY APPARATUS, EXPOSURE APPARATUS, MANUFACTURING METHOD OF FLAT PANEL DISPLAY, AND DEVICE MANUFACTURING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/129,017

(22) PCT Filed: Mar. 25, 2015

(86) PCT No.: PCT/JP2015/059090
§ 371 (c)(1),
(2) Date: Sep. 26, 2016

(87) PCT Pub. No.: WO2015/147039
PCT Pub. Date: Oct. 1, 2015

(65) Prior Publication Data
US 2017/0108785 A1   Apr. 20, 2017

(30) Foreign Application Priority Data

Mar. 26, 2014  (JP) ................................. 2014-063315

(51) Int. Cl.
*G03F 7/20* (2006.01)
(52) U.S. Cl.
CPC .................. *G03F 7/70716* (2013.01)
(58) Field of Classification Search
CPC ................. G03F 7/70716; G03F 7/70816
See application file for complete search history.

(56) References Cited

U.S. PATENT DOCUMENTS

| 5,729,331 A | 3/1998 | Tanaka et al. |
| 6,552,775 B1 | 4/2003 | Yanagihara et al. |
| 2010/0018950 A1 | 1/2010 | Aoki et al. |

(Continued)

FOREIGN PATENT DOCUMENTS

JP   2006-086442 A   3/2006

OTHER PUBLICATIONS

Jun. 9, 2015 International Search Report issued in International Patent Application No. PCT/JP2015/059090.

(Continued)

*Primary Examiner* — Deoram Persaud
(74) *Attorney, Agent, or Firm* — Oliff PLC

(57) ABSTRACT

A substrate stage apparatus includes: a fine movement stage movable along the XY plane; an XY two-dimensional stage apparatus (an X beam and an X carriage) which guides the fine movement stage in a direction parallel to the XY plane; a plurality of weight-canceling devices movable in the direction parallel to the XY plane synchronously with the fine movement stage and also working together to support the weight of the fine movement stage; a first Y step guide provided at the +Y side of the X beam in a direction parallel to the Y-axis, that guides a part of the plurality of weight-canceling devices moving in a direction parallel to the X-axis; and a second Y step guide provided at the other side of the X beam in the direction parallel to the Y-axis, that guides the other part of the plurality of weight-canceling devices moving parallel to the X-axis.

18 Claims, 10 Drawing Sheets

(56) References Cited

U.S. PATENT DOCUMENTS

| | | | |
|---|---|---|---|
| 2010/0250004 A1* | 9/2010 | Makino | B23Q 1/621 |
| | | | 700/275 |
| 2012/0056105 A1* | 3/2012 | Aoki | F16C 29/025 |
| | | | 250/491.1 |
| 2012/0057140 A1* | 3/2012 | Aoki | G03F 7/70716 |
| | | | 355/53 |
| 2012/0064460 A1* | 3/2012 | Aoki | G03F 7/709 |
| | | | 430/320 |
| 2012/0064461 A1* | 3/2012 | Aoki | G03F 7/70791 |
| | | | 430/320 |

OTHER PUBLICATIONS

Sep. 27, 2016 International Preliminary Report on Patentability issued in International Patent Application No. PCT/JP2015/059090.

* cited by examiner

MOVABLE BODY APPARATUS, EXPOSURE APPARATUS, MANUFACTURING METHOD OF FLAT PANEL DISPLAY, AND DEVICE MANUFACTURING METHOD

TECHNICAL FIELD

The present invention relates to movable body apparatuses, exposure apparatuses, manufacturing methods of flat panel displays, and device manufacturing methods, and more particularly to a movable body apparatus including a movable body movable along a predetermined two-dimensional plane, an exposure apparatus including the movable body apparatus, a manufacturing method of a flat panel display using the exposure apparatus, and a device manufacturing method using the exposure apparatus.

BACKGROUND ART

Conventionally, in a lithography process for manufacturing electronic devices (microdevices) such as liquid crystal display devices and semiconductor devices (such as integrated circuits), exposure apparatuses are used such as an exposure apparatus of a step-and-scan method (a so-called scanning stepper (also called a scanner)), which while synchronously moving a mask or a reticle (hereinafter referred to collectively as a "mask") and a glass plate or a wafer (hereinafter referred to collectively as a "substrate") along a predetermined scanning direction, transfers a pattern formed on the mask onto the substrate using an energy beam.

As this type of exposure apparatus, an apparatus is known that reduces load of an actuator used to perform positioning of a table, by supporting a table member holding a substrate from below using a weight-canceling device (also referred to as a central pillar) which is a columnar member (for example, refer to PTL 1).

Now, accompanying the increasing size of substrates in recent years, the size of the table member holding the substrate also tend to increase, and to cope with this, the size of the weight-canceling device and a guide member for guiding the weight-canceling device is also increasing.

CITATION LIST

Patent Literature

[PTL 1] U.S. Patent Application Publication No. 2010/0018950

SUMMARY OF INVENTION

Solution to Problem

The present invention was made under the circumstances described above, and from a first aspect, there is provided a movable body apparatus, comprising: a movable body movable along a predetermined two-dimensional plane including a first axis and a second axis which are orthogonal to each other; a guide device which guides the movable body in a direction parallel to the first axis and a direction parallel to the second axis; a plurality of weight supporting devices, which are movable in a direction parallel to the two-dimensional plane synchronously with the movable body, that work together to support weight of the movable body; a first guide member, which is provided at one side of the guide device in a direction parallel to the second axis, that guides some of the plurality of weight supporting devices moving in a direction parallel to the first axis; and a second guide member, which is provided at the other side of the guide device in a direction parallel to the second axis, that guides another of the plurality of weight supporting devices moving in a direction parallel to the first axis.

According to this apparatus, the plurality of weight supporting devices work together to support the weight of the movable body. That is, the individual weight supporting devices support a part of the weight of the movable body. Therefore, the load acting on the guide member for guiding the weight supporting devices can be dispersed compared with the case supposing that one weight supporting device supports the total weight of the movable body, which allows a thinner and lighter guide member. Also, since the movable body is supported at a plurality of places, this allows the movable body to be thinner and lighter, which makes position control and posture control easier.

The present invention, from a second aspect, is an exposure apparatus, comprising: a movable body apparatus according to the present invention in which a predetermined object is held by the movable body; and a pattern formation apparatus which forms a predetermined pattern on the object using an energy beam.

The present invention, from a third aspect, is a manufacturing method of a flat panel display comprising: exposing the object using the exposure apparatus according to the present invention; and developing the object which has been exposed.

The present invention, from a fourth aspect, is (20) a device manufacturing method, comprising: exposing the object using the exposure apparatus according to the present invention; and developing the object which has been exposed.

DESCRIPTION OF EMBODIMENTS

An embodiment will be described below, using FIGS. 1 to 3.

Figure 1:
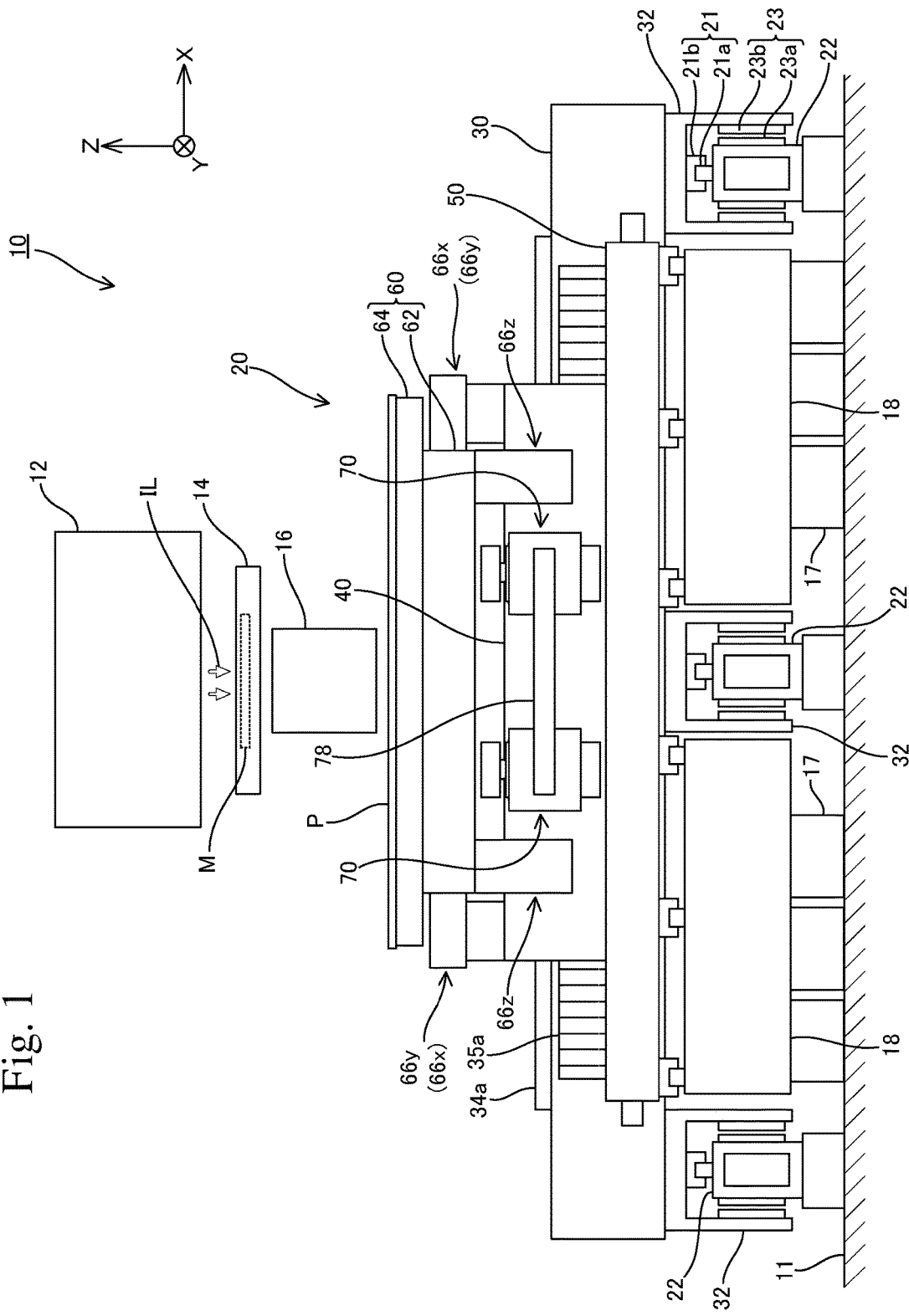
FIG. 1 A view schematically showing a structure of a liquid crystal exposure apparatus according to an embodiment.

FIG. 1 schematically shows a structure of a liquid crystal exposure apparatus 10 according to the embodiment. Liquid crystal exposure apparatus 10 is a projection exposure apparatus of a step-and-scan method, or a so-called scanner, whose exposure subject is a rectangular-shaped (square-shaped) glass substrate P (hereinafter, simply called a substrate P) used in devices such as, for example, a liquid crystal display device (a flat panel display).

Liquid crystal exposure apparatus 10 has parts including an illumination system 12, a mask stage 14 that holds a mask M on which a circuit pattern and the like is formed, a projection optical system 16, a pair of stage mounts 18, a substrate stage apparatus 20 that holds substrate P having a resist (sensitive agent) coated on its surface (the surface facing a +Z side in FIG. 1), and a control system for these parts. Hereinafter, a direction in which mask M and substrate P are each relatively scanned with respect to projection optical system 16 at the time of exposure will be described as an X-axis direction, a direction orthogonal to the X-axis within a horizontal plane will be described as a Y-axis direction, a direction orthogonal to the X-axis and the Y-axis will be described as a Z-axis direction, and rotation directions around the X-axis, the Y-axis, and the Z-axis will be described as θx, θy, and θz directions, respectively. Also, positions in the X-axis, the Y-axis, and the Z-axis directions will be described as X position, Y position, and Z position, respectively.

Illumination system 12 is structured similarly to the illumination system disclosed in, for example, U.S. Pat. No. 5,729,331. Illumination system 12 irradiates light emitted from a light source not shown (e.g., a mercury lamp) on mask M as illumination light for exposure (illumination light) IL, via parts such as a reflection mirror, a dichroic mirror, a shutter, a wavelength selection filter, and various kinds of lenses none of which are shown. As illumination light IL, for example, lights such as i-line (wavelength 365 nm), g-line (wavelength 436 nm), and h-line (wavelength 405 nm) (or synthetic lights of the above i-line, g-line, and h-line) are used.

Mask stage 14 holds a transmissive mask M. On the lower surface of mask M (the surface facing the −Z side) a predetermined circuit pattern (mask pattern) is formed. Mask stage 14 drives mask M with predetermined long strokes in the X-axis direction (scanning direction) with respect to illumination system 12 (illumination light IL) via, for example, a linear motor (not shown), along with finely driving mask M in the Y-axis direction and the θz direction. Position information of mask M in the horizontal plane is acquired, for example, by a mask stage position measurement system (not shown) including a laser interferometer.

Projection optical system 16 is placed below mask stage 14. Projection optical system 16 is a so-called multi-lens projection optical system whose structure is similar to the projection optical system disclosed in, for example, U.S. Pat. No. 6,552,775, and is equipped, for example, with a plurality of optical systems that form upright images with a double telecentric non-magnification system.

In liquid crystal exposure apparatus 10, when an illumination area on mask M is illuminated by illumination light IL from illumination system 12, the illumination light that has passed mask M forms a projection image (a part of an erected image) of the circuit pattern of mask M within the illumination area via projection optical system 16, on substrate P in an irradiation area (exposure area) of the illumination light conjugate to the illumination area. Then, scanning exposure is performed of a shot area on substrate P, by mask M relatively moving in the scanning direction with respect to the illumination area (illumination light IL) as well as substrate P relatively moving in the scanning direction with respect to the exposure area (illumination light IL), and the pattern formed on mask M is transferred on the shot area.

The pair of stage mounts 18 each consists of a plate-like member extending in the Y-axis direction, and is placed apart in the X-axis direction. Stage mounts 18 are installed on a floor 11 of a clean room, via a plurality of anti-vibration devices 17. On the upper surface of stage mounts 18, as shown in FIG. 2, for example, three Y linear guides 19a extending in the Y-axis direction are fixed, at a predetermined spacing in the X-axis direction. The pair of stage mounts 18 is a member that structures an apparatus main section (body) of liquid crystal exposure apparatus 10, and the above mask stage 14 and projection optical system 16 are supported by the apparatus main section.

Substrate stage apparatus 20 has a plurality of (in the present embodiment, e.g., three) base frames 22, an X beam 30, an X carriage 40, a pair of Y step guides 50, a fine movement stage 60 (a substrate table 62 and substrate holder 64 (not shown in FIG. 2, refer to FIG. 1)), and a plurality of (in the present embodiment, e.g., four) weight-canceling devices 70. Note that, although FIG. 2 is a plan view of substrate stage apparatus 20 shown in FIG. 1, to facilitate understanding, substrate holder 64 (refer to FIG. 1) is removed, and along with this, substrate table 62 is shown in a broken line.

For example, the three base frames 22 each consists of a member extending in the Y-axis direction, and are placed parallel to one another at a predetermined spacing in the X-axis direction. The, e.g., three base frames 22 x are installed on floor 11, with a first base frame 22 installed at the +X side of stage mount 18 on the +X side, a second base frame 22 installed at the −X side of stage mount 18 on the −X side, and a third base frame 22 installed in between the pair of stage mounts 18, in a state where each of the frames have a predetermined clearance with respect to stage mount 18. The, e.g., three base frames 22, substantially have the same structure. On the upper end surface of base frame 22 (the end at the +Z side), a Y linear guide 21a is fixed extending in the Y-axis direction, as shown in FIG. 1. Also, on each of the side surfaces at both sides of base frame 22, a Y linear motor stator 23a is fixed, including a plurality of magnet units arranged at a predetermined spacing in the Y-axis direction.

X beam 30, which consists of a member with a rectangular YZ section extending in the X-axis direction, is mounted on the, e.g., three base frames 22 described above. The Z position of the lower surface of X beam 30 is set more to the +Z side than the position of the upper surface of stage mount 18, and X beam 30 is vibrationally isolated from stage mount 18. X beam 30 is formed hollow, as shown in FIG. 3, and the dimension in the height (Z-axis) direction is set larger than the dimension in the width (Y) direction. Referring back to FIG. 1, members referred to as Y carriages 32 are fixed to the lower surface of X beam 30, in the vicinity of both ends in the longitudinal direction and at the center in the longitudinal direction, with each member corresponding to the, e.g., three base frames 22. Y carriage 32, which consists of a member having an inverted U-shaped XZ section, has base frame 22 inserted in between a pair of opposing surfaces.

A plurality of Y slide members 21b (arranged overlapping in the depth direction of FIG. 1) is fixed to the ceiling surface of Y carriage 32. The plurality of Y slide members is formed having inverted U-shaped XZ sections, and engage freely slidable with Y linear guides 21a fixed to corresponding base frames 22, via rolling bodies which are not shown (such as, e.g., a plurality of balls). Y slide members 21b and the corresponding Y linear guides 21a structure a mechanical Y linear guide device 21, which guides X beam 30 (and, for example, the three Y carriages 32) in a straight line in the Y-axis direction along the e.g., three base frames 22. Also, to each of the pair of opposing surfaces of Y carriage 32, a Y linear motor mover 23b is fixed facing Y linear motor stator 23a, which is fixed to the corresponding base frame 22. Y linear motor mover 23b has a coil unit not shown, and electrical power supplied to the coil unit is controlled by a main controller not shown. Y linear motor movers 23b and the corresponding Y linear motor stators 23a structure Y linear motors 23, which drive X beam 30 (and, for example, the three Y carriages 32) in the Y-axis direction with predetermined strokes. Because Y linear motors 23 drive X beam 30 in the center along with the vicinity of both ends, flexure in the Y-axis direction at the center is restrained. Note that, although it is not shown, a Y scale having a periodic direction in the Y-axis direction is fixed to at least one of the, e.g., three base frames 22, and to Y carriage 32 corresponding to the base frame 22, an encoder head is fixed, which structures a Y linear encoder system for acquiring position information in the Y-axis direction of Y carriage 32 along with the Y scale. Position of X beam 30 in the Y-axis direction is controlled by the main controller not shown, on the basis of the output of the above encoder head.

Figure 3:
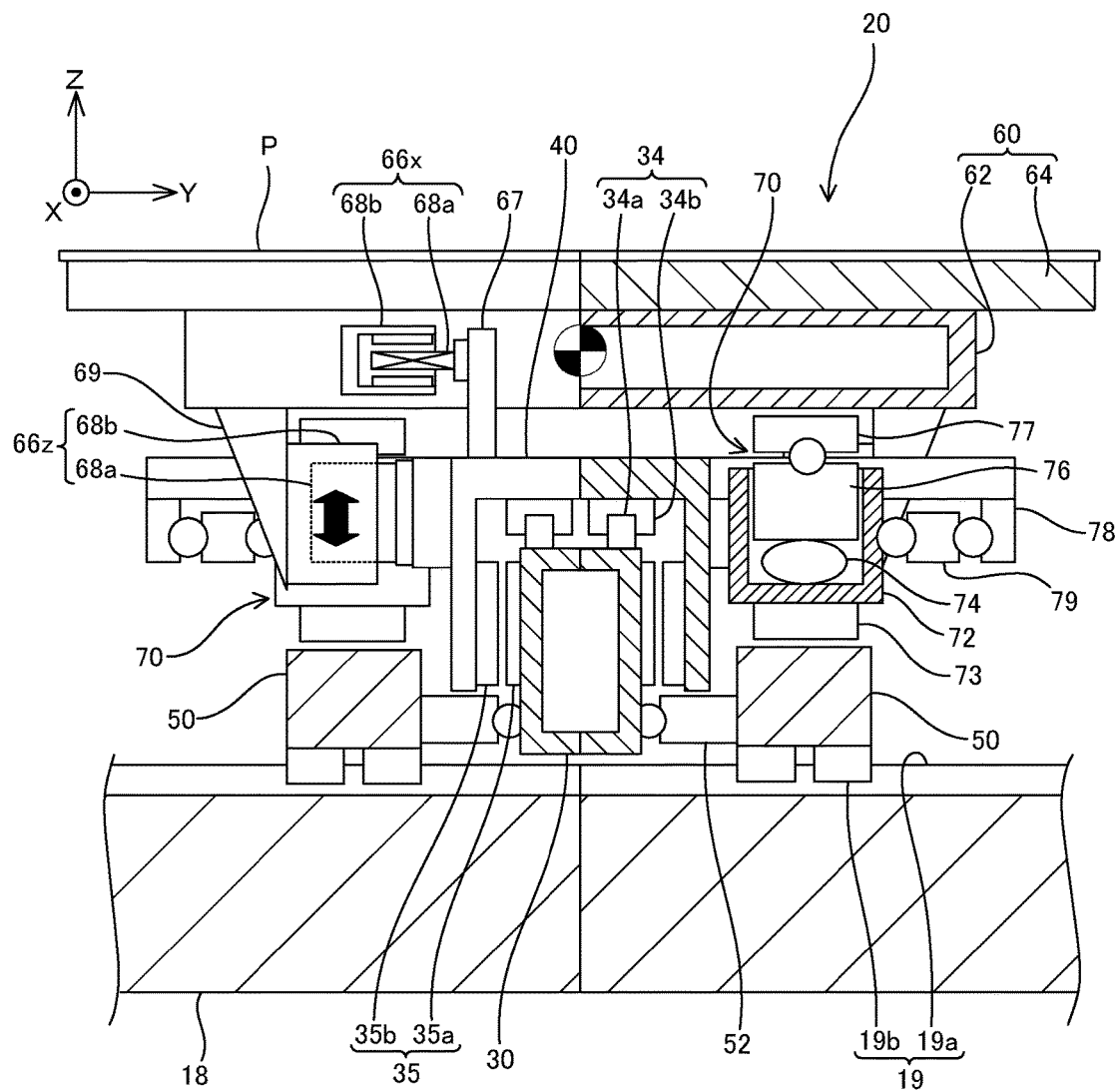
FIG. 3 A sectional view of line A-A in FIG. 2.

To the upper surface of X beam 30, a pair of X linear guides 34a is fixed as shown in FIG. 3. The pair of X linear guides 34a each consists of a member extending in the X-axis direction, and are placed parallel to each other at a predetermined spacing in the Y-axis direction. Also, to each side surface of X beam 30 on both sides, an X linear motor stator 35a is fixed, which includes a plurality of magnet units arranged at a predetermined spacing in the X-axis direction.

X carriage 40 consists of a member having an inverted U-shaped YZ section, and X beam 30 is inserted in between a pair of opposing surfaces. A plurality of X slide members 34b (arranged overlapping in the depth direction of FIG. 3) is fixed to the ceiling surface of X carriage 40. The plurality of X slide members is formed having inverted U-shaped YZ sections, and engage freely slidable with the pair of X linear guides 34a fixed to X beam 30, via rolling bodies which are not shown (such as, e.g., a plurality of balls). X slide members 34b and the corresponding X linear guides 34a structure a mechanical X linear guide device 34, which guides X carriage 40 in a straight line in the X-axis direction along X beam 30. Also, to each of the pair of opposing surfaces of X carriage 40, an X linear motor mover 35b is fixed facing X linear motor stator 35a, which is fixed to X beam 30. X linear motor mover 35b has a coil unit not shown, and electrical power supplied to the coil unit is controlled by the main controller not shown. X linear motor mover 35b and the corresponding X linear motor stator 35a structure an X linear motor 35, which drives X carriage 40 in the X-axis direction with predetermined strokes.

Relative movement of X carriage 40 in the Y-axis direction with respect to X beam 30 is restricted, due to the operation of the above X linear guide device 35. Accordingly, with substrate stage apparatus 20, X beam 30 and X carriage 40 move integrally in the Y-axis direction when X beam 30 moves in the Y-axis direction with predetermined strokes. That is, X beam 30 and X carriage 40 structure a so-called gantry type two-dimensional stage apparatus. Note that, although it is not shown, an X scale having a periodic direction in the X-axis direction is fixed to X beam 30, and to X carriage 40, an encoder head is fixed, which structures an X linear encoder system for acquiring position information in the X-axis direction of X carriage 40 along with the X scale. Position of X carriage 40 in the X-axis direction is controlled by the main controller not shown, on the basis of the output of the above encoder head.

Figure 2:
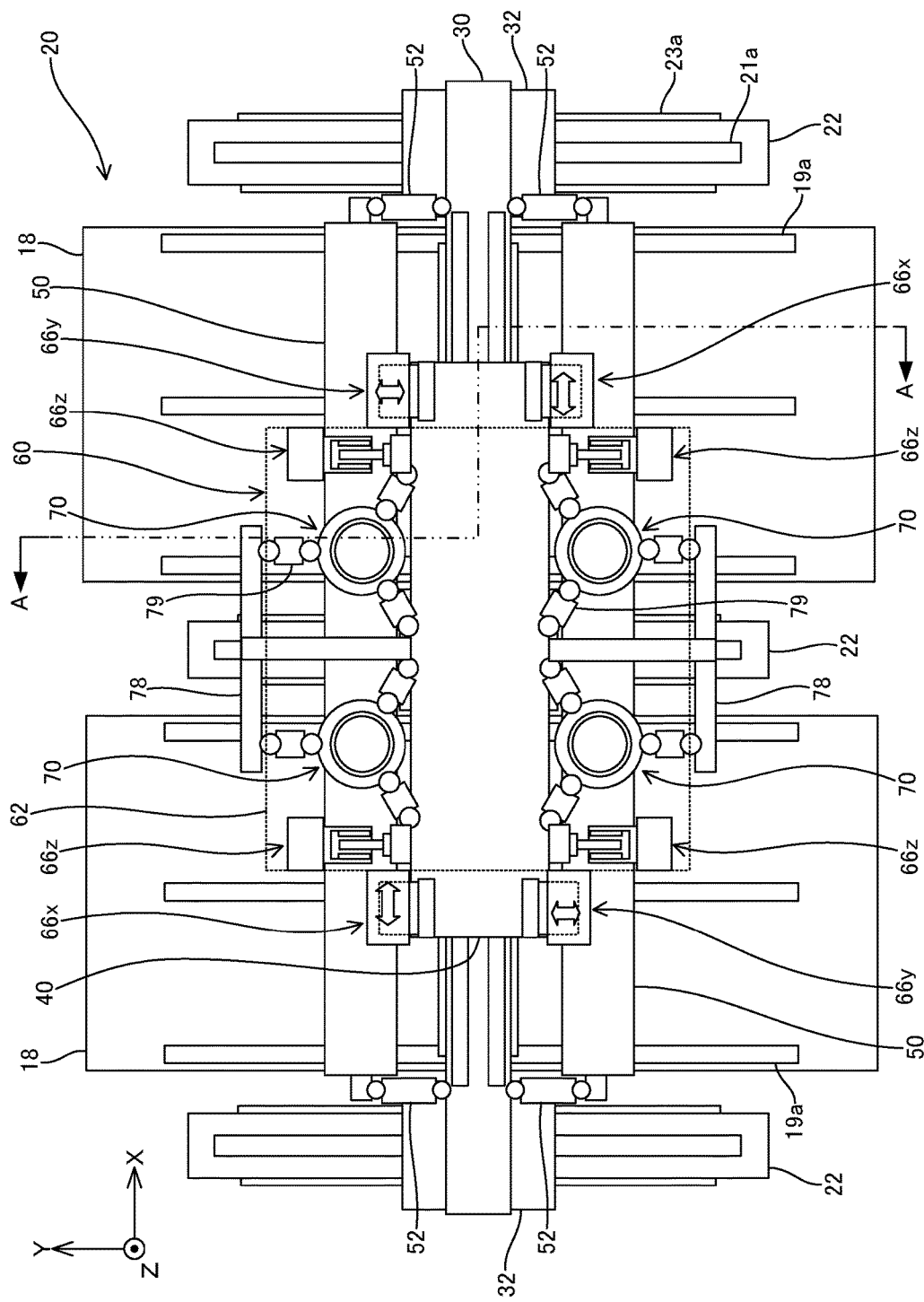
FIG. 2 A planar view (a part of the elements omitted) of a substrate stage apparatus that the liquid crystal exposure apparatus in FIG. 1 has.

The pair of Y step guides 50 is placed on the pair of stage mounts 18, as shown in FIG. 2. Of the pair of Y step guides 50, a first Y step guide 50 is placed at the +Y side of X carriage 40 and a second Y step guide 50 is placed at the −Y side of X carriage 40, parallel to each other via a predetermined clearance to X carriage 40. Y step guide 50 consists of a member extending in the X-axis direction that has a rectangular YZ section. The dimension in the longitudinal direction of Y step guide 50 is set longer than the movement strokes of fine movement stage 60 in the X-axis direction. Also, although the dimension in the width direction of Y step guide 50 is set substantially the same as the dimension in the width direction of X beam 30, the dimension in the height direction (thickness) of Y step guide 50 is set smaller (thinner) than that of X beam 30, or more specifically, formed in the thickness of around half of X beam 30, as shown in FIG. 3. The upper surface of Y step guide 50 is finished so that it has a high degree of flatness. A plurality of Y slide members 19b (arranged overlapping in the depth direction of FIG. 1) are fixed to the lower surface of Y step guide 50. The plurality of Y slide members 19b are formed having inverted U-shaped XZ sections, and engage freely slidable with Y linear guides 19a fixed to stage mount 18, via rolling bodies (such as, e.g., a plurality of balls). Y slide members 19b and the corresponding Y linear guides 19a structure a mechanical Y linear guide device 19, which guides Y step guide 50 in a straight line in the Y-axis direction on the pair of stage mounts 18.

Referring back to FIG. 2, each of the pair of Y step guides 50 is connected to X beam 30 via a plurality of (e.g., two, in the embodiment) coupling devices 52. Coupling devices 52 include a rod-shaped member extending in the Y-axis direction and hinged joint devices (e.g., a ball joint) provided at both ends in the longitudinal direction of the rod-shaped member, and the above rod-shaped member is installed in between Y step guide 50 and X beam 30, via the above hinged joint devices. Therefore, Y step guide 50 and X beam 30 are vibrationally isolated in the Z-axis direction, the θx direction, and the θy direction (hereinafter referred to as a Z tilt direction). In substrate stage apparatus 20, when X beam 30 is driven to one side of the Y-axis direction (e.g., the +Y direction), Y step guide 50 at the other side (e.g., the −Y side) moves to the one side (e.g., the +Y direction) integrally with X beam 30 by being pulled by X beam 30 via, for example, the two coupling devices 52, along with Y step guide 50 at the one side (e.g., the +Y side) moving to the one side (e.g., the +Y direction) integrally with X beam 30 by being pushed by X beam 30 via, for example, the two coupling devices 52 due to rigidity of the above rod-shaped member in the Y-axis direction.

The height position (Z position) of the plurality of coupling devices 52 roughly coincides with the center of gravity height position of Y step guide 50. Therefore, when Y step guide 50 moves in the Y-axis direction by being pulled or pushed by X beam 30, moment (pitching moment) around the X-axis does not act on Y step guide 50, so that stage mount 18 (device main section) becomes free from the risk of vibration. Note that, the pair of Y step guides 50 may be coupled to each other with a member having high rigidity, and in this case, Y step guide 50 can be moved in the Y-axis direction integrally with X beam 30 only by the pulling of one of the coupling devices 52 (+Y side or the −Y side). Accordingly, as coupling devices 52, instead of the above rod-shaped member, a rope having low rigidity in the Y-axis direction or a thin plate-like member can also be used. Note that, in the embodiment, although Y step guide 50 and X beam 30 are coupled by coupling device 52 in the vicinity of the ends in the longitudinal direction of Y step guide 50, the number and position of coupling devices 52 are not limited in particular. Also, although not shown, a cable guide device is placed between X beam 30 and each of the pair of Y step guides 50 for guiding cables, which supply electricity to X carriage 40, in accordance with the movement of X carriage 40.

Fine movement stage 60, as shown in FIG. 3, has substrate table 62 and substrate holder 64. Substrate table 62 consists of a boxlike member having a rectangular-shape in a planar view. In the present embodiment, although substrate table 62 is hollow, it may also be made solid. Substrate holder 64 consists of a plate-like member having a rectangular-shape in a planar view, and is fixed to the upper surface of substrate table 62, for example, via bolts (not shown). Substrate holder 64 has substrate P mounted on its upper surface. Substrate holder 64 holds substrate P by suction, using the vacuum chucking force supplied from a vacuum device (not shown) installed external to substrate stage device 20.

Fine movement stage 60 is finely driven in directions of three degrees of freedom (the X-axis, the Y-axis, and the θz directions) within a horizontal plane on X carriage 40, by a fine movement stage driving system which includes a plurality of voice coil motors. In the present embodiment, the plurality of voice coil motors include, e.g., two X voice coil motors 66*x*, and e.g., two Y voice coil motors 66*y*, as shown in FIG. 2.

One of the, e.g., two X voice coil motors 66*x*, and one of the, e.g., two Y voice coil motors 66*y* are placed at the +X side of substrate table 62. In the present embodiment, one of the X voice coil motors 66*x* is placed more to the −Y side than the Y position of the center (center of gravity) of substrate table 62, and one of the Y voice coil motors 66*y* is placed more to the +Y side than the Y position of the center (center of gravity) of substrate table 62, respectively. Also, the other of the, e.g., two X voice coil motors 66*x*, is placed at the −X side of substrate table 62, diagonal to the above one of the X voice coil motors 66*x* with respect to the center (center of gravity) of substrate table 62. Similarly, the other of the, e.g., two Y voice coil motors 66*y*, is placed at the −X side of substrate table 62, diagonal to the above one of the Y voice coil motors 66*y* with respect to the center (center of gravity) of substrate table 62.

The one of the X voice coil motors 66*x* (+X side of substrate table 62), as shown in FIG. 3, includes a stator 68*a* which has a T-shaped section and is fixed to the upper surface of X carriage 40 via a supporting column 67, and a mover 68*b* which has a U-shaped section and is fixed to the side surface at the +X side of substrate table 62. X voice coil motor 66*x*, which is a linear motor of a moving magnet type in which stator 68*a* has a coil unit not shown and mover 68*b* has a magnet unit not shown, generates thrust in a direction parallel to the X-axis. Since the structure of the other of the X voice coil motors 66*x* (not shown in FIG. 3, refer to FIG. 2) is the same as the one of the X voice coil motors 66*x*, the description thereabout will be omitted. Also, because the, e.g., two Y voice coil motors 66*y* (refer to FIG. 2) are moving magnet type linear motors having substantially the same structure as X voice coil motor 66*x* except for the point that the Y voice coil motor generates thrust parallel to the Y-axis, the description thereabout will be omitted. Note that, X voice coil motors 66*x* and Y voice coil motors 66*y* may also be a moving coil type linear motor. Also, the structure may be employed in which substrate table 62 is finely driven in directions of three degrees of freedom within the horizontal plane, using two-degrees-of-freedom voice coil motors that can generate thrust in the X-axis and Y-axis directions.

Also, for example, the height position (Z position) of each of the, e.g., two X voice coil motors 66*x*, and the, e.g., two Y voice coil motors 66*y* (refer to FIG. 2) roughly coincides with the center of gravity height position of fine movement stage 60, and due to the thrust given by the, e.g., two X voice coil motors 66*x*, and the, e.g., two Y voice coil motors 66*y*, rotation of fine movement stage 60 in the θx and θy directions (generation of pitching moment) is suppressed.

Referring back to FIG. 1, the main controller not shown makes the thrust in the X-axis and/or Y-axis direction(s) act on (accelerate) substrate table 62 via the above plurality of voice coil motors (X voice coil motors 66*x*, Y voice coil motors 66*y*), when making X carriage 40 move in the X-axis and/or Y-axis direction (s) with predetermined strokes. This allows fine movement stage 60, including substrate holder 64 holding substrate P, to move in the X-axis and/or Y-axis direction(s) with predetermined strokes synchronously (integrally) with X carriage 40. Also, the main controller not shown finely drives fine movement stage 60 in the θz direction with respect to X carriage 40, by making the output (thrust) of each of the, e.g., two X voice coil motors 66*x* (or the, e.g., two Y voice coil motors 66*y*) different. Note that, although it is not shown in the drawings, attached to the above X carriage 40 are parts, such as, a stopper member which mechanically sets the movement range of fine movement stage 60 with respect to X carriage 40, and a gap sensor for measuring relative movement amount of fine movement stage 60 in the X-axis and Y-axis directions with respect to X carriage 40.

Also, the fine movement stage driving system has a plurality of Z voice coil motors 66*z* for finely driving fine movement stage 60 in the Z tilt direction with respect to X carriage 40. In the present embodiment, for example, a total of four Z voice coil motors 66*z* are placed, corresponding to the four corner sections of substrate table 62, as shown in FIG. 2. Z voice coil motors 66*z*, as shown in FIG. 3, are moving magnet type linear motors that include stators 68*a* having coil units not shown and movers 68*b* having magnet units not shown, similarly to the above X voice coil motors 66*x*, and generate thrust parallel to the Z-axis. Stators 68*a* are fixed to the side surface of X carriage 40, while movers 68*b* are fixed to the lower surface of substrate table 62 via brackets 69, so that, for example, the four Z voice coil motors 66*z* are placed within the space between substrate table 62 and Y step guide 50.

Position information of fine movement stage 60 in directions of three degrees of freedom (the X-axis, the Y-axis, and the θz directions) within the horizontal plane is acquired by a laser interferometer not shown fixed to the apparatus main body, using, for example, a mirror not shown provided at substrate table 62. Also, position information in the Z tilt direction of fine movement stage 60 is acquired, for example, by a plurality of laser displacement sensors (not shown) fixed to substrate table 62, with the upper surface of Y step guide 50 (or a target fixed to weight-canceling device 70) serving as a reference. The structure of the position measurement system for measurement in directions of six degrees of freedom of the above fine movement stage 60 is disclosed in, for example, U.S. Patent Application Publication No. 2010/0018950. Note that, the structure of the position measurement system of fine movement stage 60 is not limited to this, and for example, an encoder system may also be used.

Weight-canceling devices 70 provided in the present embodiment, as shown in FIG. 2, are, e.g., four, and substrate table 62 is supported from below by the, e.g., four weight-canceling devices 70. Of the, e.g., four weight-canceling devices 70, two are mounted on Y step guide 50 at the +Y side set apart from each other in the X-axis direction, and the other two are mounted on Y step guide 50 at the −Y side set apart from each other in the X-axis direction. The, e.g., two weight-canceling devices 70 at the +Y side is placed in the space between the, e.g., two Z voice coil motors 66z at the +Y side, and the, e.g. two weight-canceling devices 70 at the −Y side is placed in the space between the, e.g., two Z voice coil motors 66z at the −Y side. The, e.g., four weight-canceling devices 70 substantially have the same structure; therefore, in the description below, one of the four weight-canceling devices will be described.

Weight-canceling device 70, as shown in FIG. 3, has a housing 72 which consists of a bottomed cylindrical member having an opening at the +Z side, an air bearing 73 attached to the lower surface of housing 72, an air spring 74 mounted on the bottom surface of housing 72, a Z slide member 76 mounted on air spring 74, and an air bearing 77 attached to Z slide member 76.

Housing 72, as shown in FIG. 2, is connected to X carriage 40, or connected to X carriage 40 via brackets 78 having a T-shape in a planar view fixed to X carriage 40, via a plurality of (e.g., three in the embodiment) coupling devices 79. Coupling devices 79 include a rod-shaped member (or a thin plate, a rope or the like) extending in a direction parallel to the XY plane and hinged joint devices (e.g., a ball joint) provided at both ends in the longitudinal direction of the rod-shaped member, and the above rod-shaped member is installed in between weight-canceling device 70 and X carriage 40 (or brackets 78), via the above hinged joint devices. The, e.g., three coupling devices 79 are placed radially around the Z-axis at an almost equal spacing. In the present embodiment, two of the, e.g., three coupling devices 79 are installed between housing 72 and X carriage 40, and the remaining coupling device 79 is installed between housing 72 and bracket 78. Positions in directions of three degrees of freedom (the X-axis, the Y-axis, and the θz directions) within the horizontal plane of housing 72 are restricted by X carriage 40 due to the operation of the, e.g., three coupling devices 79, whereas the position in the Z tilt direction is vibrationally isolated.

Air bearing 73 is attached to the bottom surface of housing 72, in a state where the bearing surface (gas blowout surface) faces the −Z side. The bearing surface of air bearing 73 faces the upper surface of Y step guide 50, and weight-canceling device 70 is mounted on Y step guide 50 in a non-contact manner by static pressure of pressurized gas which blows out from air bearing 73 to the upper surface of Y step guide 50. Note that, although one air bearing 73 is used in the present embodiment, the number of air bearings used is not limited to this, and a plurality of air bearings may be used.

To air spring 74, pressurized gas is supplied from the outside of weight-canceling device 70. Air spring 74 makes an upward force in a direction of gravitational force act on Z slide member 76. The pressure of pressurized gas supplied to air spring 74 is appropriately controlled by the main controller. Z slide member 76 consists of a cylindrical (or a plate-like) member extending in the Z-axis direction, and is inserted into the inner diameter side of housing 72. Z slide member 76 is guided to housing 72 with low friction, via, e.g., an air bearing not shown, and relative movement with respect to housing 72 is restricted in directions of five degrees of freedom (the X-axis, the Y-axis, the θz, the θx, and the θy directions). Air bearing 77 is attached to the upper end surface of Z slide member 76 freely swingable with respect to the horizontal plane via, for example, a hinge device or the like, in a state where the bearing surface (gas blowout surface) faces the +Z side. The bearing surface of air bearing 77 faces the lower surface of substrate table 62. Of the lower surface of substrate table 62, the part facing the bearing surface of air bearing 77 is finished so that it has a high degree of flatness. Weight-canceling device 70 supports substrate table 62 from below in a non-contact manner, by static pressure of the pressurized gas blowing out from air bearing 77 to the lower surface of substrate table 62.

In substrate stage apparatus 20, one weight-canceling device 70 makes an upward force in a direction of gravitational force, which is one fourth of the weight of fine movement stage 60, act on fine movement stage 60. This allows the, e.g., four weight-canceling devices 70 to work together to cancel out the weight of fine movement stage 60, which reduces the load on the, e.g., four Z voice coil motors 66z.

Also, in substrate stage apparatus 20, Z tilt position control of substrate P is appropriately performed when fine movement stage 60 holding substrate P moves in the X-axis and/or Y-axis direction(s) along with X carriage 40 in predetermined strokes. On this operation, substrate table 62 is driven in at least one direction of the Z-axis, the θx, and the θy directions by the plurality of Z voice coil motors 66z. In each of the, e.g., four weight-canceling devices 70, Z slide member 76 moves in the Z-axis direction with fine strokes by elasticity of air spring 74 along with air bearing 77 tilting (swinging) in accordance with the tilt amount of the lower surface of substrate table 62, in accordance with posture change (moving amount in a direction orthogonal to the horizontal plane, change of tilt amount with respect to the horizontal plane) of substrate table 62. On this operation, the movement of each of the, e.g., four weight-canceling devices 70 is independent. This allows the weight of fine movement stage 60 to be supported constantly by the, e.g., four weight-canceling devices 70, regardless of the posture of fine movement stage 60.

In substrate stage device 20, when X carriage 40 (and fine movement stage 60) and X beam 30 move integrally in the Y-axis direction with predetermined strokes, each of the, e.g., four weight-canceling devices 70 moves integrally with X carriage 40 in the Y-axis direction with predetermined strokes, by being pulled (or pushed) by X carriage 40 via the plurality of coupling devices 79 (and brackets 78). On this operation, since X beam 30 and the, e.g., two Y step guides 50, move integrally in the Y-axis direction, weight-canceling devices 70 do not fall off from the corresponding Y step guides 50. Also, when X carriage 40 (and fine movement stage 60) moves in the X-axis direction along X beam 30 with predetermined strokes (including the case when there is also movement in the Y-axis direction), each of the, e.g., four weight-canceling devices 70, moves integrally with X carriage 40 in the X-axis direction with predetermined strokes on the corresponding Y step guides 50, by being pulled (or pushed) by X carriage 40 via the plurality of coupling devices 79 (and brackets 78). The Z position of the, e.g., three coupling devices 79, described above is set to about the same as the center of gravity height position of weight-canceling device 70, which prevents weight-canceling device 70 from rotating around an axial direction orthogonal to the moving directions (θx, θy) when X carriage 40 moves.

In liquid crystal exposure apparatus 10 (refer to FIG. 1) structured as described above, loading of mask M onto mask stage 14 by a mask loader not shown and loading of substrate P onto substrate stage apparatus 20 by a substrate loader not shown are executed, under the control of the main controller not shown. Then, the main controller executes alignment measurement using an alignment detection system not shown, and when the alignment measurement has been completed, executes exposure operation of the step-and-scan method. Note that, since the exposure operation is similar to the exposure of the step-and-scan method conventionally performed, details thereabout will be omitted.

On the above exposure operation, the main controller not shown performs control (automatic focusing control) of appropriately driving fine movement stage 60 in the Z tilt direction using the above plurality of Z voice coil motors 66$z$ so that, for example, the surface of substrate P is positioned within the depth of focus of projection optical system 16 (refer to FIG. 1). On this automatic focusing control, substrate table 62 is finely driven in the Z tilt direction by the plurality of Z voice coil motors 66$z$. Then, the main controller separately controls each of the plurality of weight-canceling devices 70, or more specifically, for example, controls the pressure of the pressurized gas supplied to air spring 74, so that a predetermined upward force is constantly generated regardless of the Z position of substrate table 62. This reduces the load on the plurality of Z voice coil motors 66$z$.

With substrate stage apparatus 20 according to the embodiment described so far, because the, e.g., four weight-canceling devices 70, support the weight of fine movement stage 60 (that is, the individual weight-canceling devices 70 only has to support, for example, one fourth of the weight of fine movement stage 60), the load acting on Y step guide 50 guiding (supporting) each of the, e.g., four weight-canceling devices 70, is dispersed when compared with the case of a substrate stage apparatus (hereinafter referred to as a substrate stage apparatus (not shown) of a comparative example) on the supposition that the substrate stage apparatus supports the whole weight of fine movement stage 60 using one weight-canceling device. Accordingly, Y step guide 50 (and stage mount 18 which supports Y step guide 50) can be made thinner and lighter than that of the above substrate stage apparatus of a comparative example. Also, because the individual weight-canceling devices 70 can be made smaller and lighter than the above comparative example, air bearing 73 for levitating weight-canceling devices 70 on Y step guide 50 and air bearing 77 for supporting substrate table 62 in a non-contact manner can each be made smaller. Also, thinner Y step guides 50 and smaller weight-canceling devices 70 can lower the total height of substrate stage apparatus 20.

Also, because the structure is employed, for example, of supporting substrate table 62 from below at four places, deformation caused by the weight of substrate table 62 can be suppressed when compared with the substrate stage apparatus of the above comparative example. Accordingly, substrate table 62, in itself, can be made thinner and lighter, which improves position controllability of fine movement stage 60. Also, a lighter substrate table 62 allows the voice coil motors (X voice coil motors 66$x$, Y voice coil motors 66$y$, and Z voice coil motors 66$z$) for finely driving substrate table 62 to be more compact and power saving. Also, substrate table 62 has high rigidity with respect to pitching moment because substrate table 62 is supported by the, e.g., four weight-canceling devices 70.

Also, because the structure is employed in which substrate table 62 is supported at four places which are not located on the same straight line, posture of fine movement stage 60 is stable when compared with that of the substrate stage apparatus of the above comparative example. Accordingly, an auxiliary device for preventing substrate table 62 from tilting (falling) such as when, for example, maintenance of substrate stage apparatus 20 is performed, will not be necessary. Also, the bearing device (e.g., a spherical bearing device, or a pseudospherical bearing device as is disclosed in, for example, U.S. Patent Application Publication No. 2010/0018950) for creating a swingable state for fine movement stage 60 will not be necessary, which simplifies the structure of substrate stage apparatus 20.

Also, because the XY two-dimensional stage (X beam 30 and X carriage 40) for guiding fine movement stage 60 along the XY plane is placed between the pair of Y step guides 50, the entire structure of substrate stage apparatus 20 is compact. Also, this improves maintainability of weight-canceling devices 70.

Figure 4:
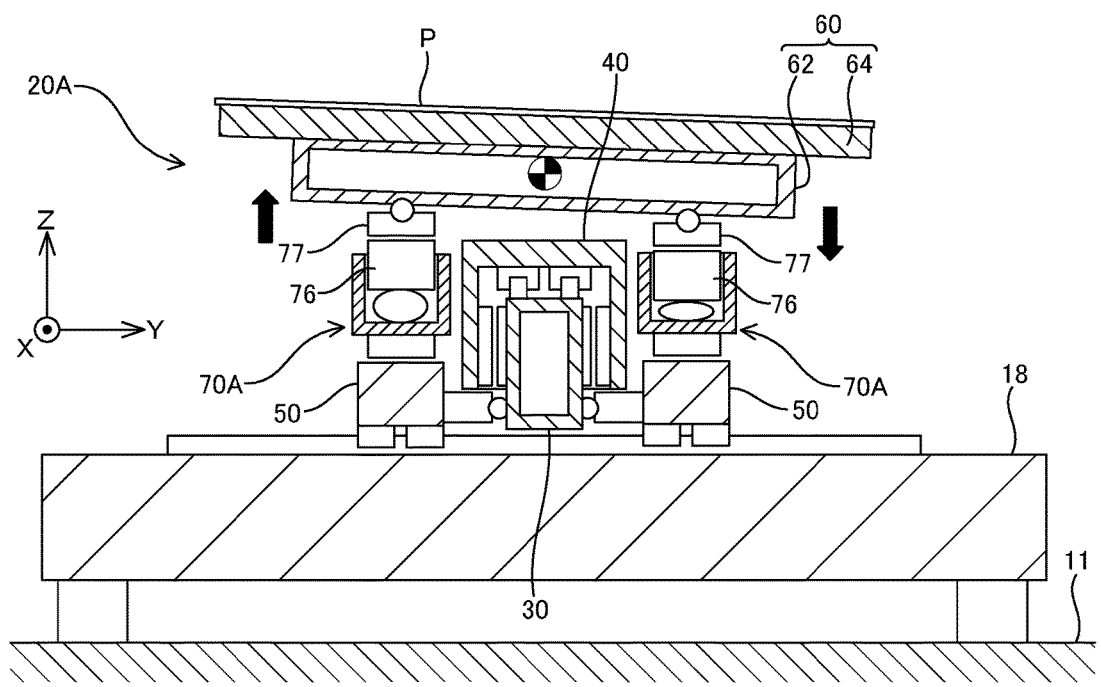
FIG. 4 A view showing a first modified example of the substrate stage apparatus.

Note that, the structure of substrate stage apparatus 20 according to the embodiment described so far can be appropriately changed. For example, like substrate stage apparatus 20A according to a first modified example shown in FIG. 4, air bearing 77 may be attached to the lower surface of substrate table 62 in a freely tiltable manner, while facing the upper end surface (end surface at the +Z side) of Z slide member 76 of weight-canceling device 70A. In substrate stage apparatus 20A according to the first modified example, the bearing surface of air bearing 77 is constantly maintained parallel to the upper end surface (the XY plane) of Z slide member 76, regardless of the posture (tilt angle with respect to the horizontal plane) of fine movement stage 60. Accordingly, this keeps substrate table 62 from moving accidentally due to its own weight along the guide surface formed by the plurality of air bearings 77.

Figure 5:
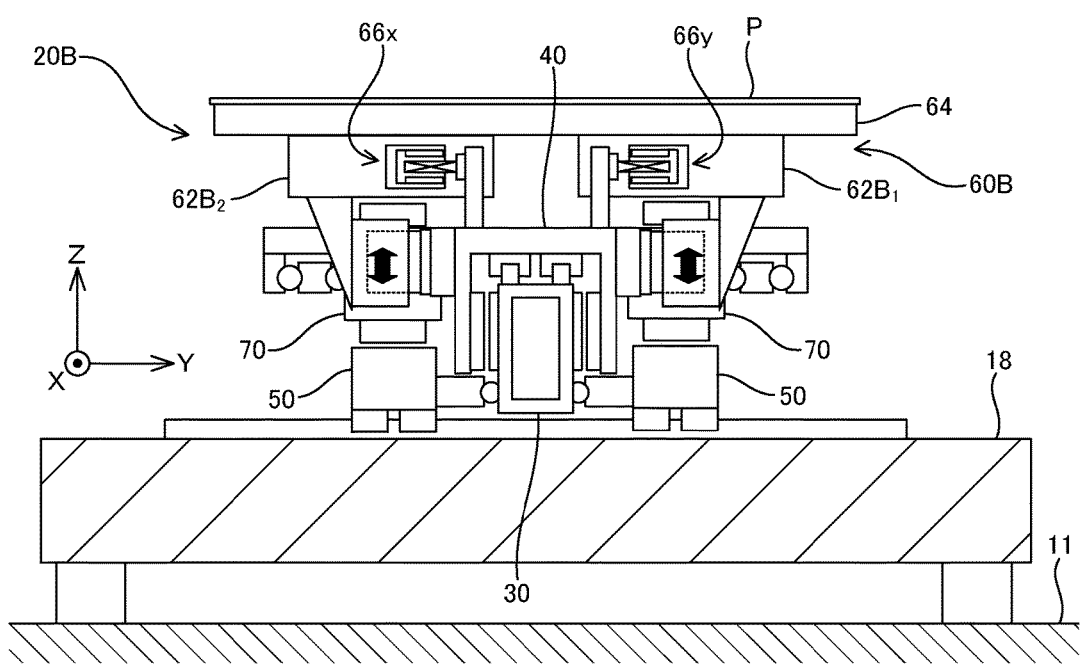
FIG. 5 A view showing a second modified example of the substrate stage apparatus.

Also, for example, like a substrate stage apparatus 20B according to a second modified example shown in FIG. 5, fine movement stage 60B may have a first substrate table 62B$_1$, which is supported by, e.g., two (overlapping in a direction in the depth of the page surface in FIG. 5) weight-canceling devices 70 mounted on Y step guide 50 at the +Y side, and a second substrate table 62B$_2$, which is supported by, e.g., two (overlapping in a direction in the depth of the page surface in FIG. 5) weight-canceling devices 70 mounted on Y step guide 50 at the −Y side. The first substrate table 62B$_1$ and the second substrate table 62B$_2$ are structured by separate members that are placed apart in the Y-axis direction. Substrate holder 64 is fixed on the first substrate table 62B$_1$ and the second substrate table 62B$_2$. According to the second modified example, fine movement stage 60B can be made lighter than that of substrate stage apparatus 20 according to the above embodiment. Also, since the first substrate table 62B$_1$ and the second substrate table 62B$_2$ are separate, even if thermal expansion or thermal contraction occurs in substrate holder 64, the first substrate table 62B$_1$ and the second substrate table 62B$_2$, distortion of substrate holder 64 caused by the difference in the expansion amount or the contraction amount between each of the members (a phenomenon similar to a so-called bimetal phenomenon) hardly occurs, which favorably maintains the flatness of the upper surface of substrate holder 64.

Note that, while substrate stage apparatus 20B is structured so that the first substrate table 62B$_1$ is supported by the, e.g., two weight-canceling devices 70 at the +Y side, and the second substrate table 62B$_2$ is supported by the, e.g., two weight-canceling devices 70 at the −Y side (that is, a structure in which substrate table 62 (refer to FIG. 3) of the first embodiment is divided into two members (substrate table 62B$_1$ and substrate table 62B$_2$) corresponding to the two Y step guides 50). This, however, is not limiting, and for example, a structure may be employed in which substrate table 62 (refer to FIG. 3) may be divided into two members in correspondence with the two weight-canceling devices 70 at the +X side and the two weight-canceling devices 70 (refer to FIG. 2 for each of the devices) at the −X side. Or, a structure may be employed in which substrate table 62 (refer to FIG. 3) may be divided into four members in correspondence with each of the, e.g., four weight-canceling devices 70.

Figure 6:
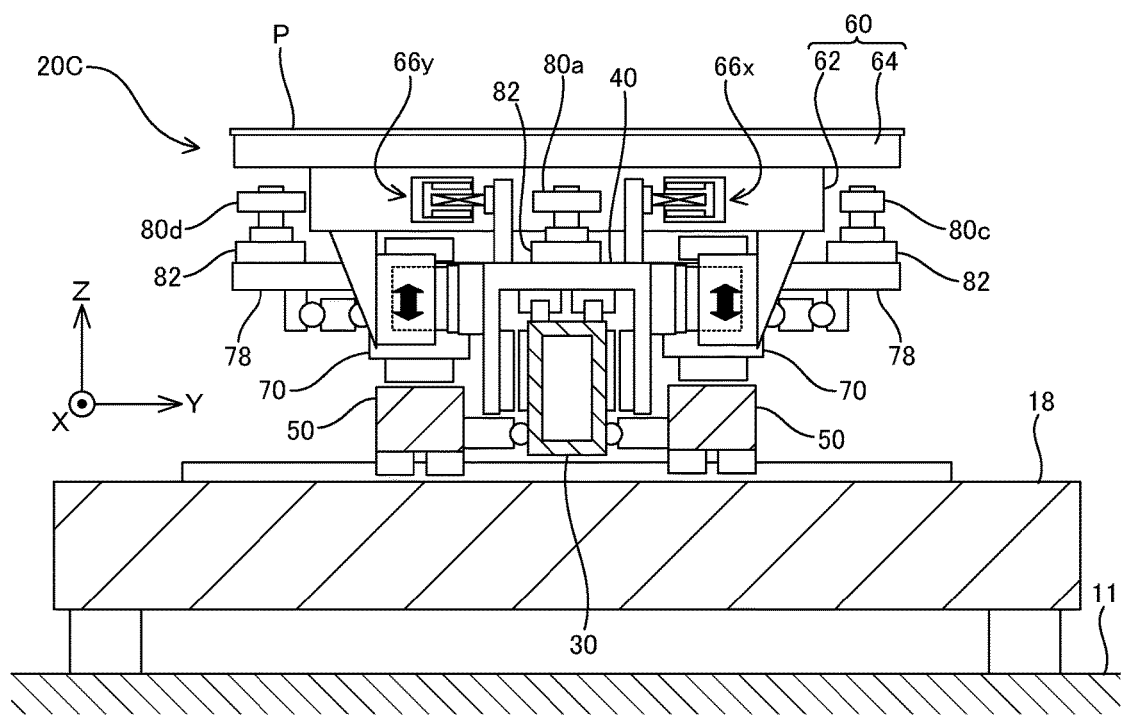
FIG. 6 A view showing a third modified example of the substrate stage apparatus.
Figure 7:
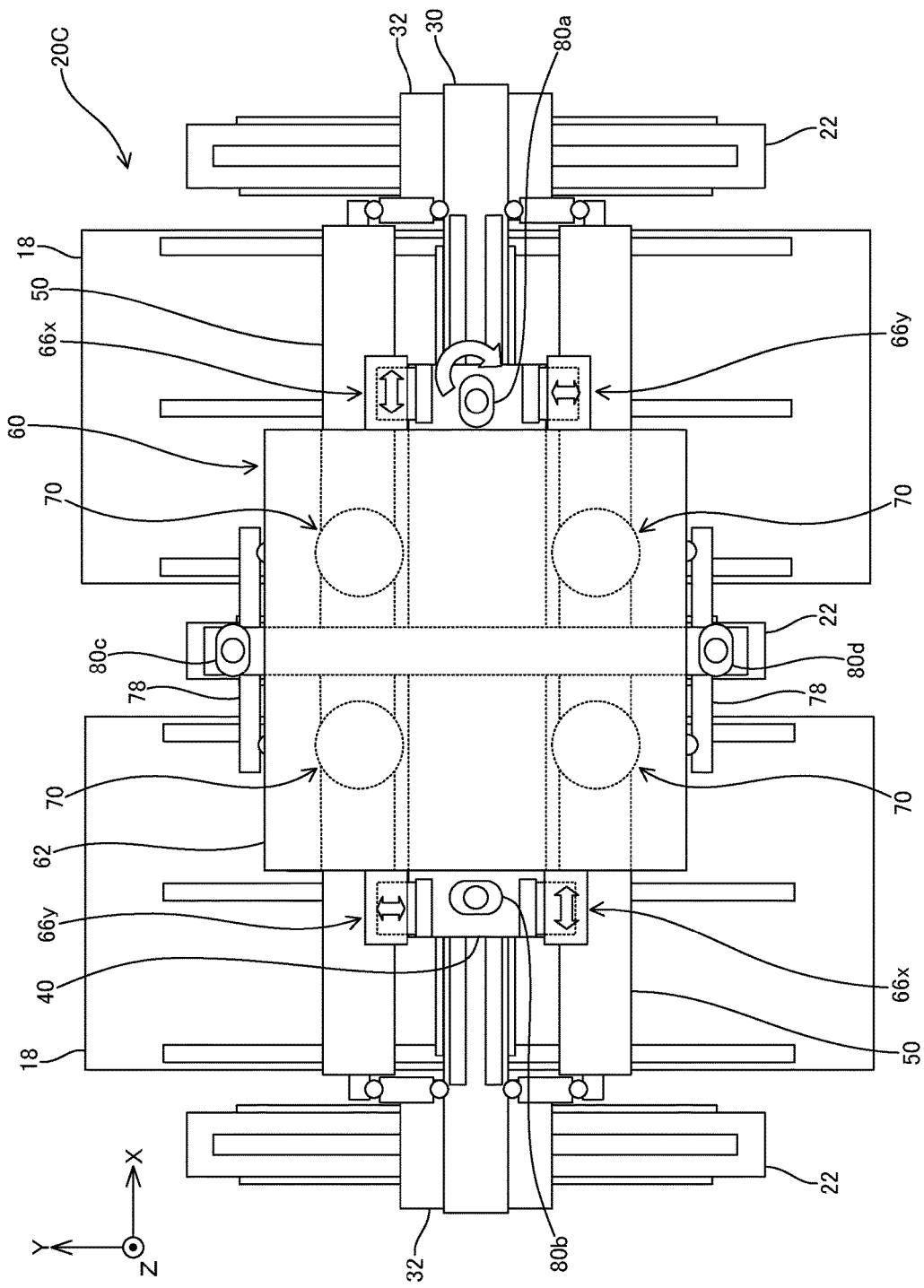
FIG. 7 A planar view (a part of the elements omitted) of the substrate stage apparatus in FIG. 6.

Alternately, like a substrate stage apparatus 20C according to a third modified example shown in, for example, FIGS. 6 and 7, spheroids 80*a* to 80*d*, for X carriage 40 to push substrate table 62 when accelerating and decelerating fine movement stage 60 (only substrate table 62 is shown in FIG. 7), may be placed facing each of the side surfaces of substrate table 62 at the +X, −X, +Y and −Y sides, as shown in FIG. 7. Spheroids 80*a* to 80*d* are each disposed as shown in FIG. 6, rotatable around an axis parallel to the Z-axis by X carriage 40 or rotary motors 82 placed on brackets 78, for example, at an angle of 90 degrees.

In substrate stage apparatus 20C, for example, when accelerating substrate table 62 which is in a stopped state in the −X direction as shown in FIG. 7, spheroid 80*a* placed at the +X side of substrate table 62 is rotationally driven to a position where its long axis is parallel with the X-axis. Then, by moving X carriage 40 in the −X direction in a state where the outer peripheral surface of spheroid 80*a* and the side surface of substrate table 62 are in contact, thrust can be given from X carriage 40 to substrate table 62 (substrate table 62 can be accelerated) without using X voice coil motor 66*x*. In contrast, in the case of controlling the position of substrate table 62 within the horizontal plane with high precision, spheroid 80*a* is rotationally driven to a position so that its long axis is parallel to the side surface of substrate table 62 that spheroid 80*a* faces, like for example, each of the spheroids 80*b* to 80*d* at the −X, the +Y, and the −Y sides in FIG. 7. In this state, substrate table 62 can be finely driven, since a predetermined clearance is formed between spheroids 80*a* to 80*d* and substrate table 62. According to the third modified example, the energy efficiency is high, since fine movement stage 60 can be accelerated/decelerated without using X voice coil motors 66*x* and Y voice coil motors 66*y*.

Figure 8:
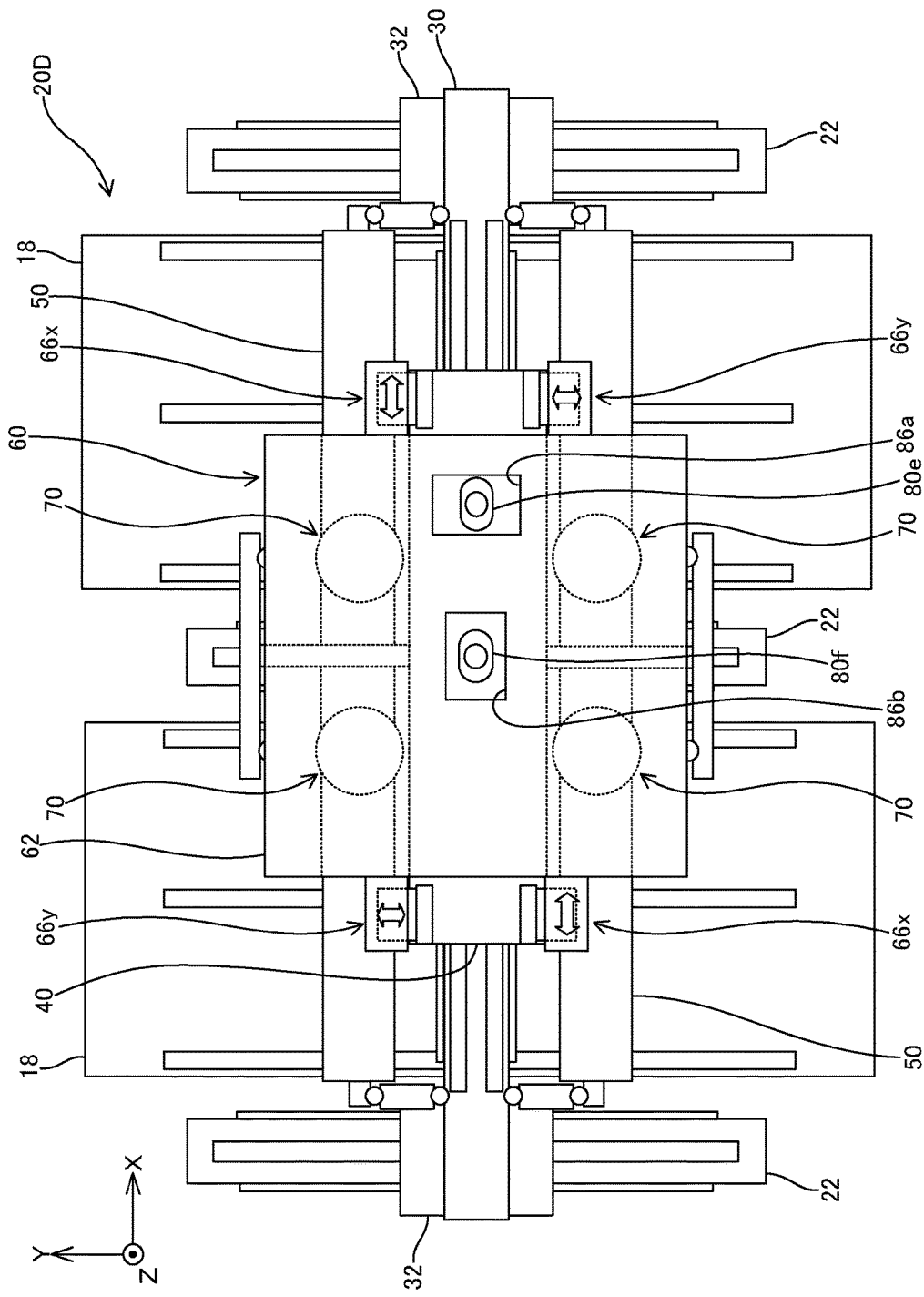
FIG. 8 A view showing a fourth modified example of the substrate stage apparatus.

Note that, although spheroids 80*a* to 80*d* were placed external to substrate table 62 in the third modified example, this is not limiting, and for example, spheroids 80*e* and 80*f* may be housed in openings 86*a* and 86*b* formed in substrate table 62 like substrate stage apparatus 20D according to a fourth modified example, as shown in FIG. 8. Spacing in the X-axis direction between wall surfaces that set opening 86*a* and spacing in the Y-axis direction between wall surfaces that set opening 86*b* are set about the same as (actually slightly longer than) the length of the long axis of spheroids 80*e* and 80*f*. In the fourth modified example, when accelerating/decelerating substrate table 62 in the X-axis direction, the long axis of spheroid 80*e* is to be parallel to the X-axis, and when accelerating/decelerating substrate table 62 in the Y-axis direction, the long axis of spheroid 80*f* is to be parallel to the Y-axis. Also, when finely driving substrate table 62, the long axis of spheroid 80*e* is to be parallel to the Y-axis, and the long axis of spheroid 80*f* is to be parallel to the X-axis.

Figure 9:
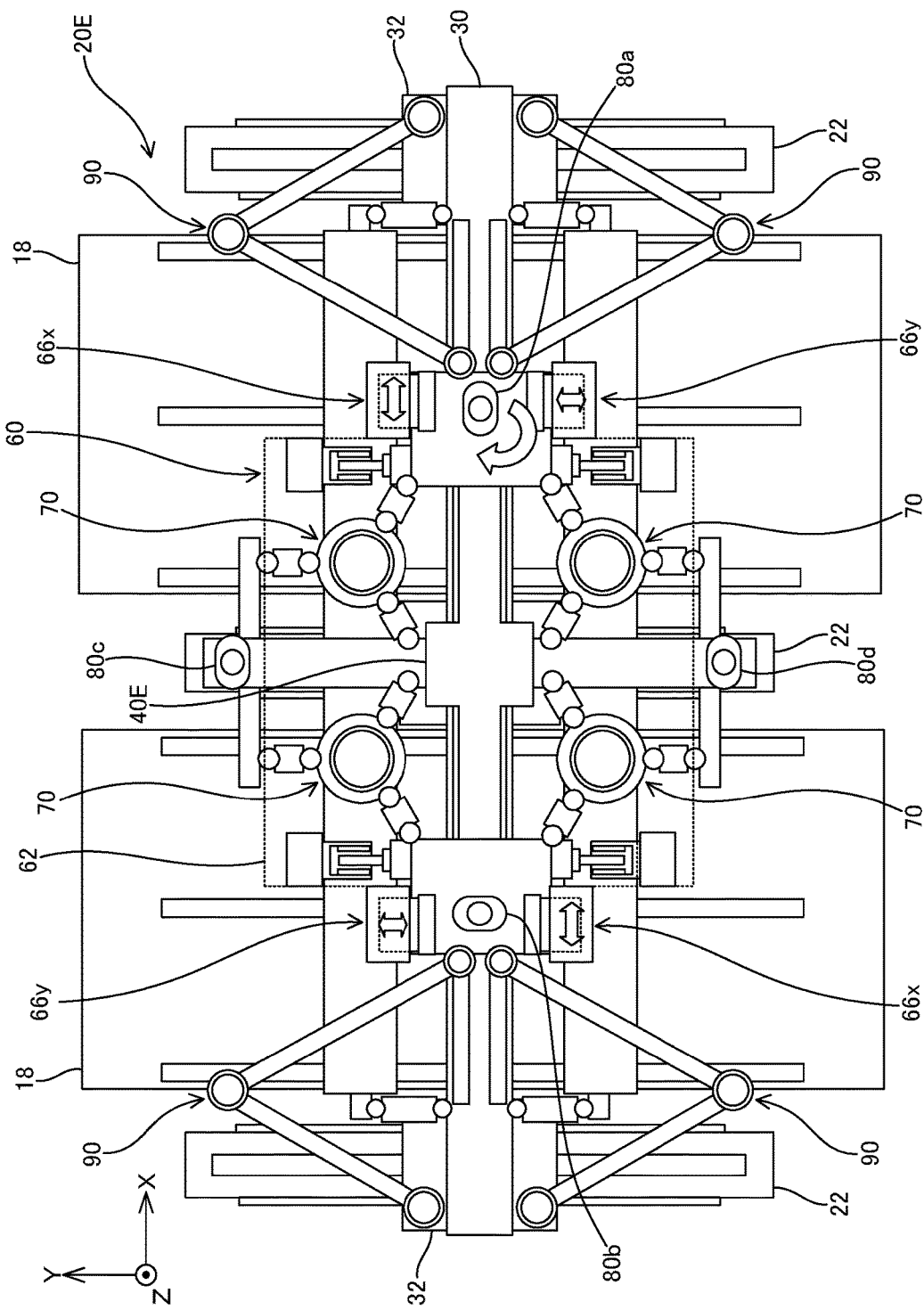
FIG. 9 A view showing a fifth modified example of the substrate stage apparatus.

Also, in the above embodiment (and the first to fourth modified examples), although X beam 30 is driven by Y linear motor 23 (refer to FIG. 1) and X carriage 40 is driven by X linear motor 35 (refer to FIG. 3), respectively, the type of actuators for driving X beam 30 and X carriage 40 are not limited to these, and for example, devices including a feed screw device, a belt driving device, and a wire driving device may also be used. Also, in substrate stage apparatus 20, 20A to 20D, because the X position of substrate table 62 is controlled by high precision by the fine movement stage driving system including the X voice coil motor 66*x* (fine movement stage 60 is finely driven), positioning accuracy of the X position of X carriage 40 may be lower than that of substrate table 62. Therefore, like substrate stage apparatus 20E according to a fifth modified example shown, for example, in FIG. 9, X carriage 40E may be driven by, e.g., four X actuators 90, including a link mechanism having a V-shape in a planar view laid between X carriage 40E and Y carriage 32, and a rotary motor which drives the link mechanism. In substrate stage apparatus 20E, the, e.g., two X actuators 90, placed at the +X side of X carriage 40E and the e.g., two X actuators 90, placed at the −X side of X carriage 40E work together to drive X carriage 40E in the X-axis direction with predetermined strokes.

Figure 10:
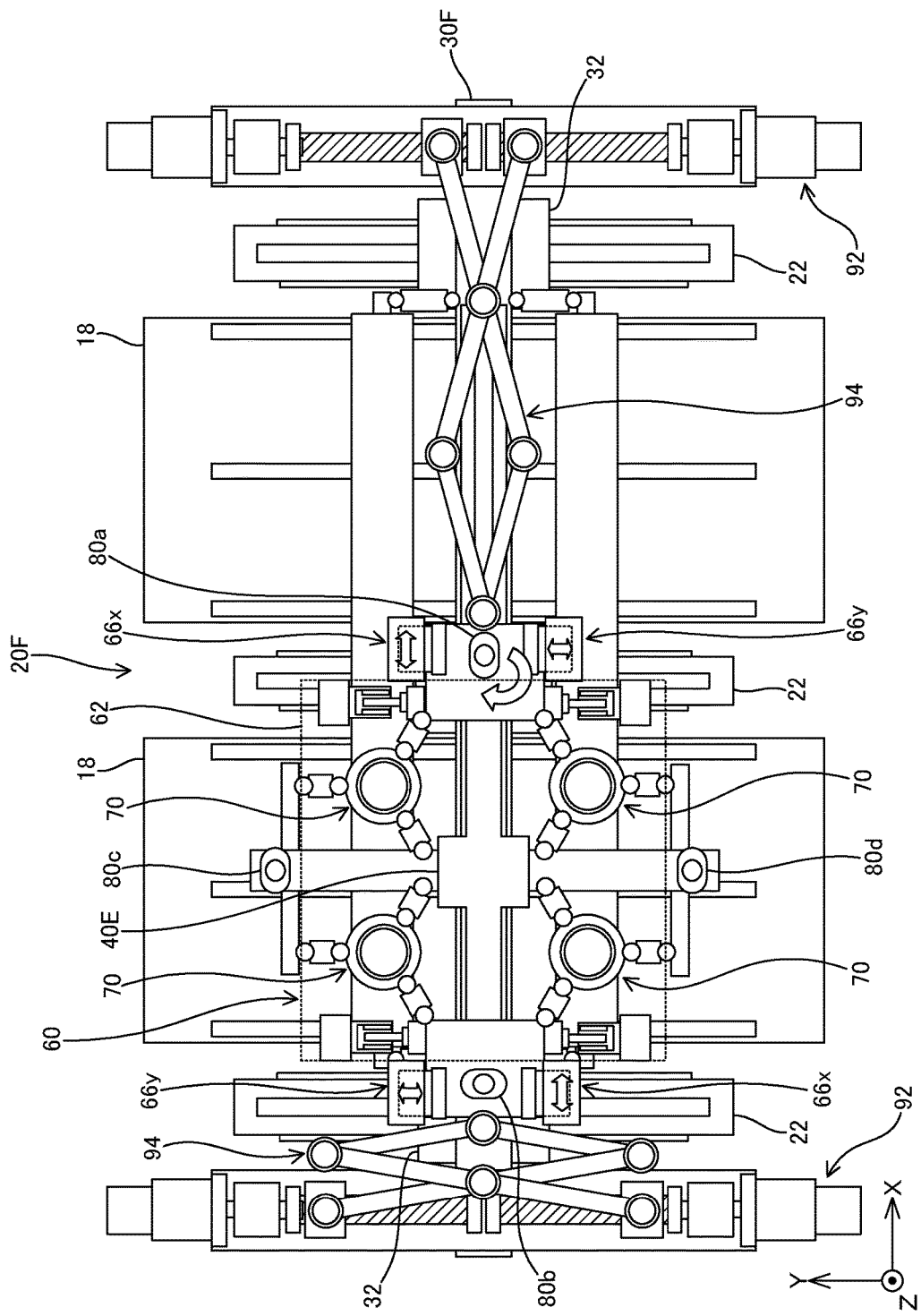
FIG. 10 A view showing a sixth modified example of the substrate stage apparatus.

Note that, while X actuators 90 according to the above fifth modified example employed the structure in which the link mechanism itself had actuators, this is not limiting, and as in a substrate stage apparatus 20F according to a sixth modified example shown, for example, in FIG. 10, the link mechanism may be driven by a feed screw device 92 mounted on an X beam 30F.

Also, in the above embodiment (including the first to fifth modified examples, the same shall apply hereinafter), while the structure was employed in which a plurality of weight-canceling devices 70 were pulled by X carriage 40, the structure for integrally moving weight-canceling devices 70 and X carriage 40 can be appropriately changed. For example, a structure may be employed in which X carriage 40 pushes weight-canceling device 70 (for example, in a non-contact manner, via an air bearing). Also, a structure may be employed in which a plurality of weight-canceling devices 70 are coupled to one another with a predetermined coupling member, and the coupling member pulls (or pushes) X carriage 40. Also, a structure may be employed in which a plurality of weight-canceling devices 70 are driven in a non-contact manner by an actuator (including, for example, a voice coil motor having a stator fixed to X carriage 40 and a mover fixed to weight-canceling device 70, respectively) with respect to X carriage 40.

Also, in the above embodiment, while the structure in which the, e.g., two weight-canceling devices 70 supported fine movement stage 60 on Y step guide 50 at the +Y side, and the, e.g., two weight-canceling devices 70 supported fine movement stage 60 on Y step guide 50 at the −Y side, the number and placement of weight-canceling devices 70 can be appropriately changed. That is, one each of weight-canceling devices 70 may be placed on Y step guide 50 at the +Y side and Y step guide 50 at the −Y side. Also, the number of weight-canceling devices 70 mounted on the pair of Y step guides 50 may differ. For example, the structure may be employed in which one weight-canceling device 70 is mounted on one of the Y step guides 50, and two weight-canceling devices 70 are mounted on the other Y step guide 50. Also, the number of weight-canceling devices 70 mounted on one Y step guide 50 is not limited in particular if the number is one or more. For example, three or more weight-canceling devices 70 may be mounted.

Further, in the above embodiment, the structure is employed in which the driving mechanism in the X-axis direction including X beam 30, X linear guide device 34, X linear motor 35 and X carriage 40 is disposed in the Y-axis direction between the pair of Y step guides 50. However, a structure may be employed in which a plurality of the driving mechanisms in the X-axis direction are disposed with the pair of Y step guides 50 arranged in between in the Y-axis direction. In this case, instead of coupling devices 52, for example, a coupling device which couples the pair of Y step guides 50 to each other in the Y-axis direction should be provided. Also, a coupling device for coupling weight-canceling device 70 on one of the Y step guides 50 and weight-canceling device 70 on the other Y step guide 50 to each other should be provided. Also, the fine movement stage driving system for finely driving fine movement stage 60 in directions of three degrees of freedom should be provided at each X carriage 40. Also, in this case, a structure can be employed in which one weight-canceling device 70 is provided with respect to the pair of Y step guides 50. On employing this structure, the air bearing provided for supporting the one weight-canceling device (in other words, a set of a housing and an air spring), instead of air bearing 73, should be, for example, an air bearing placed astride the pair of Y step guides 50, or a plurality of air bearings corresponding to each of the Y step guides 50 with respect to one housing.

Also, in the above embodiment, while the structure is employed in which three sets of the driving mechanisms in the Y-axis direction, including base frame 22, Y linear guide device 21 provided at base frame 22, Y linear motor 23 and Y carriage 32, are placed, the structure in which four or more sets are placed may also be employed. In this case, stage mount 18 and Y linear guide device 19 should be placed, for example, in the X-axis direction in between the plurality of driving mechanisms in the Y-axis direction.

Also, in the above embodiment, a sensor (called a Z sensor) can be appropriately placed that can measure the height position of fine movement stage 60 driven in the Z-axis direction by Z voice coil motors 66z, with respect to a predetermined reference surface. In this case, the Z sensor can be a sensor which, by irradiating a beam on a surface of a predetermined reference member provided at, for example, the upper surface of Y step guide 50 or weight-canceling device 70 and detecting the reflected beams, measures the height position (distance in the Z-axis direction) with respect to the reflection surface. Also, the number and the position to place the Z sensor can be appropriately set, and for example, a plurality of Z sensors may be provided in correspondence with each of the pair of Y step guides 50, or a plurality of Z sensors may be provided in correspondence with each of the plurality of weight-canceling devices 70. Furthermore, a mechanism for calibrating (calibration of) mutual measurement results of the plurality of Z sensors should be provided. Or, instead of providing the plurality of Z sensors, one Z sensor which refers to a typical reference surface may be provided.

Also, the illumination light may be ultraviolet light such as an ArF excimer laser light (wavelength 193 nm), KrF excimer laser light (wavelength 248 nm), or vacuum-ultraviolet light such as an $F_2$ laser light (wavelength 157 nm). Also, as the illumination light, for example, a harmonic wave may be used, which is a single-wavelength laser beaming the infrared or visual region oscillated from a DFB semiconductor laser or a fiber laser amplified by an erbium-doped (or erbium-and-ytterbium doped) fiber amplifier, and then whose wavelength is converted into the ultraviolet light using a nonlinear crystal. Also, solid-state lasers (wavelength: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus to which the embodiment is applied is not limited to the exposure apparatus for liquid crystals which transfers the liquid crystal display device pattern onto a square-shaped glass plate, and may also be widely applied, for example, to an exposure apparatus for manufacturing organic EL (Electro-Luminescence) panels, an exposure apparatus for manufacturing semiconductors, or to an exposure apparatus for manufacturing thin film magnetic heads, micromachines, and DNA chips. Also, the above embodiment can be applied not only to an exposure apparatus for manufacturing microdevices such as semiconductors, but also to an exposure apparatus that transfers a circuit pattern onto a glass substrate or a silicon wafer to manufacture a reticle or a mask used in an optical exposure apparatus, an EUV exposure apparatus, an X-ray exposure apparatus, and an electron-beam exposure apparatus.

Also, the object subject to exposure is not limited to a glass plate, and may also be other objects, such as, for example, a wafer, a ceramic substrate, a film member, or a mask blank. Also, in the case the exposure object is a substrate for a flat panel display, the thickness of the substrate is not limited in particular, and includes, for example, a film-like substrate (a sheet-like member having flexibility). It is to be noted that the exposure apparatus of the present embodiment is especially effective in the case when the exposure object is a substrate whose length of a side or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the above embodiments, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the above embodiment, this allows a highly integrated device to be manufactured with good productivity.

It is to be noted that all publications, international publications, U.S. patent application Publications, and U.S. patents quoted in the above embodiment related to the exposure apparatus and the like, in their entirety, are incorporated herein by reference.

INDUSTRIAL APPLICABILITY

As described so far, the movable body apparatus of the present invention is suitable for driving a movable body along a predetermined two-dimensional plane. Also, the exposure apparatus of the present invention is suitable for forming a predetermined pattern on an object. Also, the manufacturing method of flat panel displays of the present invention is suitable for producing flat panel displays. Also, the device manufacturing method of the present invention is suitable for producing microdevices.

REFERENCE SIGNS LIST

10 . . . liquid crystal exposure apparatus,
20 . . . substrate stage apparatus,
30 . . . X beam,
40 . . . X carriage,
50 . . . Y step guide,
60 . . . fine movement stage,
70 . . . weight-canceling device,
P . . . substrate.

The invention claimed is:

1. A movable body apparatus, comprising:
a movable body that holds an object and is movable in a first direction and a second direction intersecting each other;
a supporting device that has a first supporting section and a second supporting section, the first supporting section and the second supporting section respectively supporting portions, different from each other in the second direction, of the movable body in a non-contact manner;
a guide member having a first guide member and a second guide member that is provided spaced apart from the first guide member in the second direction, the first guide member supporting, in a non-contact manner, the first supporting section relatively movably, and the second guide member supporting, in a non-contact manner, the second supporting section relatively movably;
a driving device that has a first driving section and a second driving section and is provided between the first guide member and the second guide member in the second direction, the first driving section relatively moving the first guide member and the second guide member in the first direction in a state where the supporting device supports the movable body, in a state where the first supporting section faces the first guide member and also the second supporting section faces the second guide member, and the second driving section moving the first guide member, the first supporting section on the first guide member, the second guide member and the second supporting section on the second guide member in the second direction;
a first base that supports the driving device; and
a second base that is disposed spaced apart from the first base in the first direction, and supports the guide member that supports the supporting device.

2. The movable body apparatus according to claim 1, wherein
the supporting device supports the movable body in a non-contact manner, via an air bearing provided at one of the supporting device and the movable body.

3. The movable body apparatus according to claim 2, wherein
the air bearing is provided at the one of the supporting device and the movable body in a state tiltable with respect to a two-dimensional plane including the first direction and the second direction.

4. An exposure apparatus, comprising:
the movable body apparatus according to claim 1; and a pattern formation apparatus which forms a predetermined pattern on the object using an energy beam.

5. The exposure apparatus according to claim 4, wherein
the movable body holding the object moves relatively in the first direction with respect to the energy beam, when the predetermined pattern is formed on the object.

6. The exposure apparatus according to claim 4, wherein
the object is a substrate used in a flat panel display.

7. The exposure apparatus according to claim 6, wherein
the substrate has at least one of a side length and a diagonal length that is 500 mm and over.

8. A manufacturing method of a flat panel display, comprising:
exposing the object using the exposure apparatus according to claim 6; and
developing the object which has been exposed.

9. A device manufacturing method, comprising:
exposing the object using the exposure apparatus according to claim 4; and
developing the object which has been exposed.

10. The movable body apparatus according to claim 1, wherein
the first supporting section and the second supporting section support portions, of the movable body, away from each other in the second direction with a center of gravity of the movable body in between.

11. The movable body apparatus according to claim 10, wherein
the supporting device has a third supporting section that supports a portion of the movable body that is different in the first direction from a portion of the movable body supported by the first supporting section.

12. The movable body apparatus according to claim 11, wherein
the first supporting section and the third supporting section support portions, of the movable body, away from each other in the first direction with a center of gravity of the movable body in between.

13. The movable body apparatus according to claim 11, wherein
the first guide member supports, in a non-contact manner, the third supporting section relatively movably.

14. The movable body apparatus according to claim 11, wherein
the first to the third supporting sections are disposed at positions corresponding to three points that are not aligned on a same straight line within a two-dimensional plane including the first direction and the second direction.

15. The movable body apparatus according to claim 11, wherein
the movable body is movable further in a tilting direction with respect to a two-dimensional plane including the first direction and the second direction, and
the first to the third supporting sections operate independently in accordance with a posture of the movable body in the tilting direction.

16. The movable body apparatus according to claim 1, wherein
the second driving section supports the first driving section.

17. The movable body apparatus according to claim 1, further comprising
a connecting section that connects the first driving section and the supporting device, wherein the first driving section moves the supporting device supporting the movable body in the first direction, via the connecting section.

18. The movable body apparatus according to claim 1, further comprising:
a connecting device that connects the second driving section and the supporting device, wherein
the second driving section moves the supporting device and the first and the second guide members in the second direction, via the connecting device.

* * * * *